(12) United States Patent
Lee et al.

(10) Patent No.: US 11,848,502 B2
(45) Date of Patent: Dec. 19, 2023

(54) ELECTRONIC DEVICE

(71) Applicant: GETAC HOLDINGS CORPORATION, Hsinchu County (TW)

(72) Inventors: Kun-Cheng Lee, Taipei (TW); Min-Yu Wang, Taipei (TW)

(73) Assignee: GETAC HOLDINGS CORPORATION, Hsinchu County (TW)

( * ) Notice: Subject to any disclaimer, the term of this patent is extended or adjusted under 35 U.S.C. 154(b) by 0 days.

(21) Appl. No.: 17/360,963

(22) Filed: Jun. 28, 2021

(65) Prior Publication Data

US 2022/0200169 A1 Jun. 23, 2022

Related U.S. Application Data

(60) Provisional application No. 63/130,310, filed on Dec. 23, 2020.

(51) Int. Cl.
| | | |
|---|---|---|
| *H01Q 1/22* | (2006.01) | |
| *H01Q 1/24* | (2006.01) | |
| *H01Q 21/28* | (2006.01) | |
| *H01Q 5/30* | (2015.01) | |
| *G06F 1/16* | (2006.01) | |
| *H05K 7/14* | (2006.01) | |

(52) U.S. Cl.
CPC .......... *H01Q 21/28* (2013.01); *G06F 1/1684* (2013.01); *H01Q 1/2266* (2013.01); *H01Q 1/243* (2013.01); *H01Q 5/30* (2015.01); *H05K 7/1427* (2013.01)

(58) Field of Classification Search
CPC ...... H01Q 21/28; H01Q 1/2266; H01Q 1/243; H01Q 5/30; H01Q 1/22; H01Q 1/521; H01Q 21/24; H01Q 21/30; G06F 1/1698; G06F 1/1684; H05K 7/1427
See application file for complete search history.

(56) References Cited

U.S. PATENT DOCUMENTS

| | | | | |
|---|---|---|---|---|
| 2018/0123236 A1* | 5/2018 | Van Gils | .............. | H01Q 1/3275 |
| 2020/0021015 A1* | 1/2020 | Yun | ........................ | H01Q 21/28 |
| 2020/0021040 A1* | 1/2020 | Yong | ...................... | H01Q 1/243 |
| 2020/0059006 A1* | 2/2020 | Kojima | .................. | H01Q 9/045 |
| 2021/0280981 A1* | 9/2021 | Kim | ...................... | H01Q 21/28 |

* cited by examiner

*Primary Examiner* — Hai V Tran
*Assistant Examiner* — Michael M Bouizza
(74) *Attorney, Agent, or Firm* — Cooper Legal Group, LLC

(57) ABSTRACT

An electronic device is provided according to an embodiment of the present invention. The electronic device includes a housing, a first antenna module, a second antenna module, and a shared frame. The housing has an accommodating space. The shared frame is arranged in the accommodating space and comprises a first and a second support portion. The first antenna module is arranged on the first support portion, and the second antenna module is arranged on the second support portion. The first antenna module is for transmitting and receiving a signal of a first frequency band. The second antenna module is for transmitting and receiving a signal of a second frequency band. A virtual reference surface is defined below the housing, and a projection range of the first antenna module on the virtual reference surface partially overlaps with a projection range of the second support portion on the virtual reference surface.

8 Claims, 4 Drawing Sheets

ELECTRONIC DEVICE

CROSS-REFERENCE TO RELATED APPLICATIONS

The present application claims the benefit of U.S. Provisional Patent Application No. 63/130,310, filed on Dec. 23, 2020, the disclosure of which is hereby incorporated by reference herein in its entirety.

BACKGROUND OF THE INVENTION

Field of the Invention

The present invention relates to an electronic device and, more particularly, to an electronic device in which antenna modules of two different wireless communication standards are arranged in the same accommodating space.

Description of the Prior Art

Accompanied with the thriving development of wireless broadband networks and mobile communication technologies, various electronic products having wireless communication functions (e.g., cell phones, tablet computers and laptop computers) are popular in mass quantities, such that the number of antenna elements has also increased with the evolving communication technologies. However, an available space inside an electronic product does not expand as antenna elements increase, and a distance between one antenna element and another antenna element or a distance between one antenna element and another electronic component of the electronic product is also significantly reduced, resulting in coupling between the antenna elements or coupling with another electronic component, as well as undesirably affecting antenna performance and communication quality, hence bringing numerous new difficult challenges to designers.

SUMMARY OF THE INVENTION

In view of the above, an electronic device is provided according to an embodiment of the present invention. The electronic device includes a housing, a first antenna module, a second antenna module, and a shared frame. The housing has a side, and the side has an accommodating space. The first antenna module is arranged in the accommodating space, and is for transmitting and receiving a signal of a first frequency band. The second antenna module is arranged in the accommodating space, and is for transmitting and receiving a signal of a second frequency band. The shared frame is arranged in the accommodating space and comprises a first support portion and a second support portion. The first antenna module is arranged on the first support portion, and the second antenna module is arranged on the second support portion. A virtual reference surface is defined below the housing, and a projection range of the first antenna module on the virtual reference surface partially overlaps with a projection range of the second support portion on the virtual reference surface.

In one embodiment of the present invention, the first frequency band includes a 2.4 GHz frequency band and a 5 GHz frequency band, and the second frequency band includes a 13.56 MHz frequency band.

In one embodiment of the present invention, the first antenna module is substantially parallel to the virtual reference surface, and the second antenna module is substantially perpendicular to the virtual reference surface.

In one embodiment of the present invention, the first antenna module and the second antenna module have different polarization forms.

In one embodiment of the present invention, the first antenna module is linearly polarized, and the second antenna module is circularly polarized.

In one embodiment of the present invention, a first communication circuit coupled to the first antenna module is further included. The first communication circuit performs communication by the first antenna module according to a first communication protocol, wherein the first communication protocol complies with a wireless local area network (LAN) communication protocol.

In one embodiment of the present invention, the accommodating space includes a shared frame. The shared frame includes a first support portion and a second support portion. The first antenna module is arranged on the first support portion, and the second antenna module is arranged on the second support portion.

In one embodiment of the present invention, wherein the second antenna module is formed of a flexible material, and the second antenna module covers the second support portion and appears as L-shaped.

In the electronic device provided according to an embodiment of the present invention, the first antenna module and the second antenna module of two different wireless communication standards are arranged in the same accommodating space on the side of the housing. The first antenna module is arranged on the first support portion of the shared frame in the accommodating space, and is substantially parallel to the virtual reference surface defined below the housing. The second antenna module is arranged on the second support portion of the shared frame in the accommodating space, and is substantially perpendicular to the virtual reference surface. Thus, radiation field types of the first antenna module and the second antenna module in space are substantially orthogonal, and mutual electromagnetic interference in between is significantly reduced. Accordingly, the first antenna module and the second antenna module of two different wireless communication standards are integrated in the same accommodating space.

The description above is merely a brief summary of the technical solutions of the present invention. To more clearly understand the technical means of the present invention, the technical means can be implemented according to the disclosure of the description. Moreover, to better explain the above and other objects, features and advantages of the present invention, preferred embodiments are described in detail with the accompanying drawings below.

DETAILED DESCRIPTION OF THE EMBODIMENTS

Figure 1:
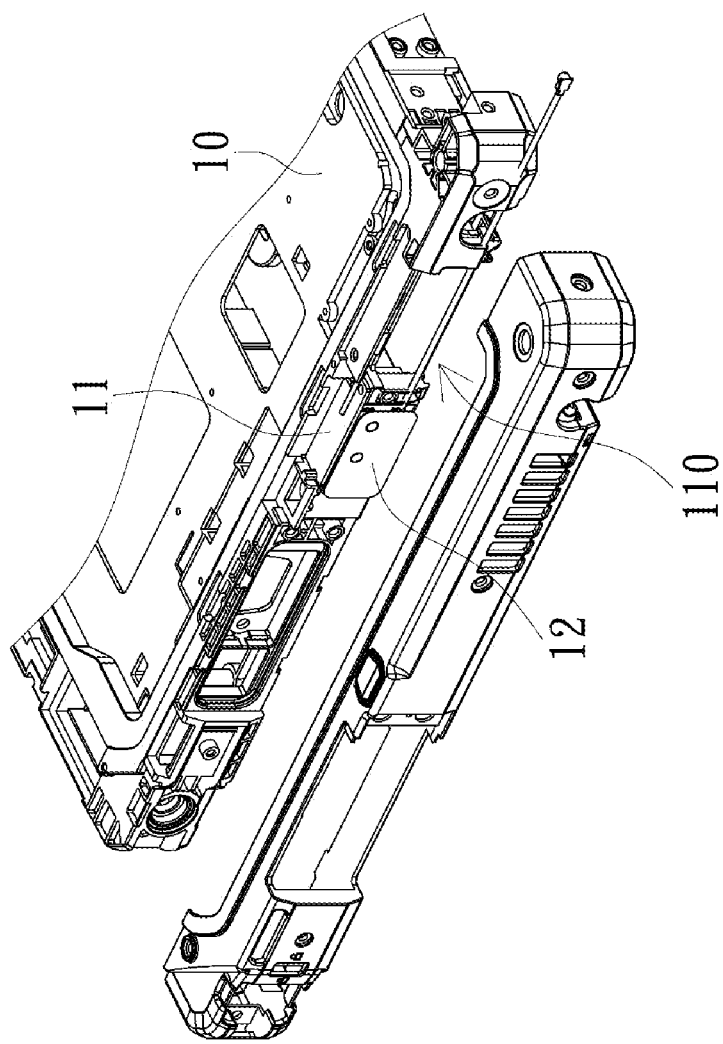
FIG. 1 is a partial exploded schematic diagram of an electronic device depicted according to an embodiment of the present invention.
Figure 2:
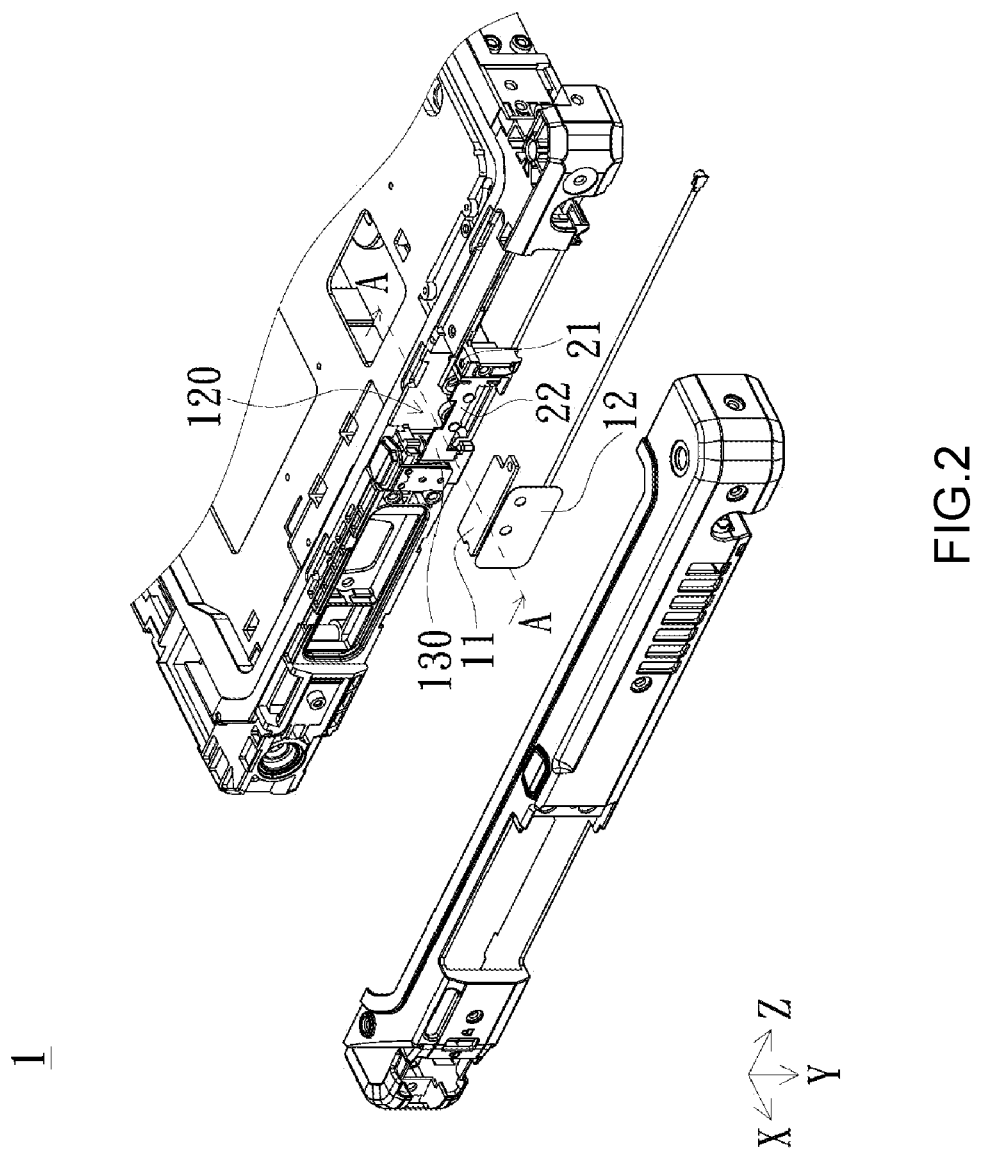
FIG. 2 is a partial exploded schematic diagram of antenna modules of an electronic device depicted according to an embodiment of the present invention.
Figure 3:
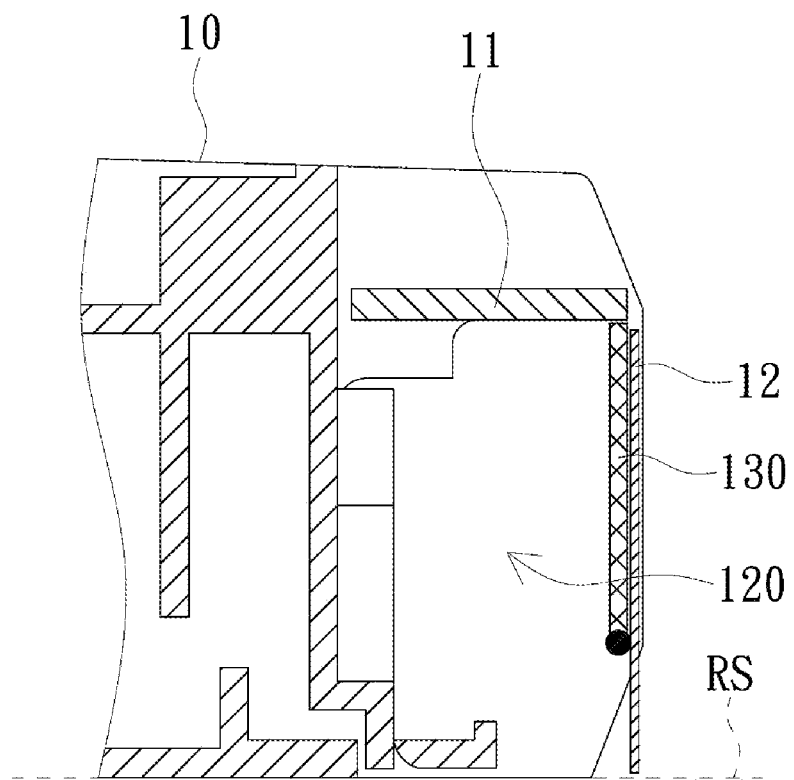
FIG. 3 is a cross-sectional schematic diagram of the electronic device in FIG. 2 taken along a section line A-A'.
Figure 4:
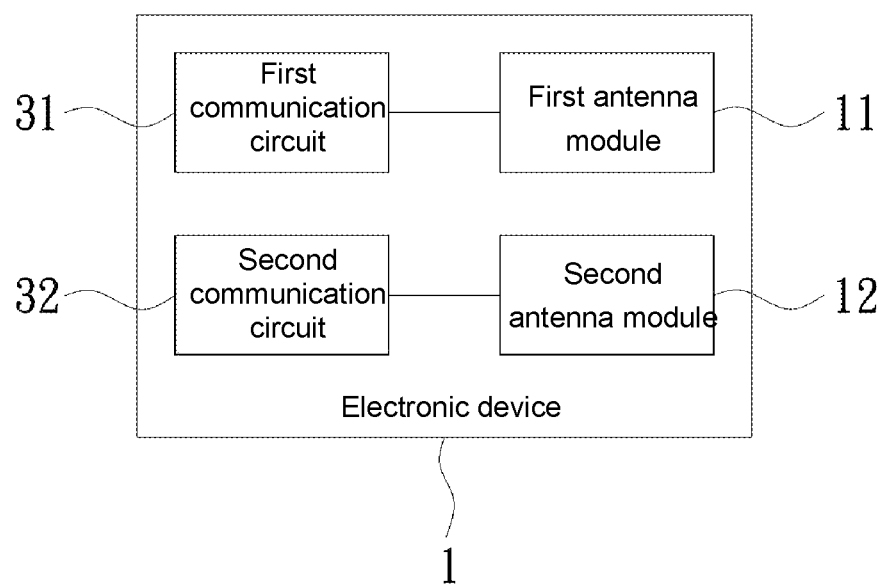
FIG. 4 is a schematic diagram of a system structure of an electronic device depicted according to an embodiment of the present invention.

Referring to FIG. 1 to FIG. 3, FIG. 1 shows a partial exploded schematic diagram of an electronic device depicted according to an embodiment of the present invention, FIG. 2 shows a partial exploded schematic diagram of antenna modules of an electronic device depicted according to an embodiment of the present invention, and FIG. 3 shows a cross-sectional schematic diagram of the electronic device in FIG. 2 taken along a section line A-A'. An electronic device 1 provided according to an embodiment of the present invention has multiple different wireless communication standards. The electronic device 1 includes a housing 10, a first antenna module 11 and a second antenna module 12. The housing 10 has a side 110, and the side 110 has an accommodating space 120 for accommodating and placing the first antenna module 11 and the second antenna module 12. The accommodating space 120 includes a shared frame 130 which has a first support portion 21 and a second support portion 22 for placing the first antenna module 11 and the second antenna module 12. The first antenna module 11 is preferably arranged on the first support portion 21 and the second antenna module 12 is preferably arranged on the second support portion 22. Further, the shard frame 130 is preferably in a plastic material but is not limited thereto.

The first antenna module 11 is arranged in the accommodating space 120, and is for transmitting and/or receiving a signal of a first frequency band, such as the 2.4 GHz frequency band or 5 GHz frequency band. The second antenna module 12 is accommodated in the accommodating space 120, and is for transmitting and/or receiving a signal of a second frequency band, such as the 13.56 MHz frequency band. Further, a virtual reference surface RS is defined below or on the back of the housing 10, the first antenna module 11 is substantially parallel to the virtual reference surface RS, and the second antenna module 12 is substantially perpendicular to the virtual reference surface RS, that is, substantially parallel to the side 110. A projection range of the first antenna module 11 on the virtual reference surface RS partially overlaps with a projection range of the second support portion 22 on the virtual reference surface RS. The first antenna module 11 and the second antenna module 12 are both arranged in the accommodating space 120, and are placed at positions substantially appearing the shape of an inverted L, and radiation field types thereof in space are substantially orthogonal. Thus, mutual electromagnetic interference in between can be significantly reduced, accordingly integrating the first antenna module 11 and the second antenna module 12 of two different wireless communication standards in the same accommodating space 120 and providing normal operations.

In one embodiment of the present invention, the first antenna module 11 is preferably a linearly polarized antenna, for example, a chip antenna, that is, the radiation field type thereof in space is in a linear polarization form; the second antenna module 12 is preferably a circularly polarized antenna, e.g., a circularly polarized loop antenna, that is, the radiation field type thereof in space is in a circular polarization form. Since the radiation field types of the first antenna module 11 and the second antenna module 12 in space have different polarization forms, the mutual electromagnetic interference in between can be effectively minimized.

Moreover, the second antenna module 12 is arranged on the side 110 of the housing 10, that is, the sensing range is in the position of the side 110. Thus, a user can easily align a sensing card having an RFID function with the sensing range (that is, placing the sensing card in a correct sensing position), thereby enhancing utilization convenience and accuracy for a user.

The second antenna module 12 is preferably formed of a flexible material, for example, a flexible printed circuit board. In one embodiment of the present invention, the second antenna module 12 covers the second support portion 22 and appears as L-shaped (not shown); that is, a part of the second support portion 22 is substantially perpendicular to the virtual reference surface RS, and the remaining part thereof is substantially parallel to the virtual reference surface RS. Since the sensing range of the second antenna module 12 extends from the side 110 to below or the back of the housing 10 and substantially appears as L-shaped, utilization convenience and accuracy for a user can be further enhanced compared to a case where the sensing range is located only in one position of the side 110.

The electronic device 1 further includes a first communication circuit 31 coupled to the first antenna module 11 and a second communication circuit 32 coupled to the second antenna module 12. The first communication circuit 31 includes a baseband circuit and a radio-frequency (RF) circuit, processes a baseband signal and an RF signal according to a first communication protocol, and performs communication (that is, transmitting or receiving a signal) through the first antenna module 11. The second communication circuit 32 includes a baseband circuit and an RF circuit, processes a baseband signal and an RF signal according to a second communication protocol, and performs communication through the second antenna module 12. The first communication protocol complies with the wireless local area network (LAN) communication protocol, and the second communication protocol complies with the radio-frequency identification (RFID) communication protocol. It should be noted that, since the first communication circuit 31 and the second communication circuit 32 are within the scope of prior art, and are not further described herein.

In conclusion, in the electronic device provided according to an embodiment of the present invention, the first antenna module and the second antenna module of two different wireless communication standards are arranged in the same accommodating space on the side of the housing. The first antenna module is arranged on the first support portion of the shared frame in the accommodating space, and is substantially parallel to the virtual reference surface defined below the housing. The second antenna module is arranged on the second support portion of the shared frame in the accommodating space, and is substantially perpendicular to the virtual reference surface. Thus, radiation field types of the first antenna module and the second antenna module in space are substantially orthogonal, and mutual electromagnetic interference in between is significantly reduced. Accordingly, the first antenna module and the second antenna module of two different wireless communication standards are integrated in the same accommodating space.

While the present invention has been disclosed by way of the embodiments above, it is to be understood that the present invention is not limited thereto. Changes and modifications can be made by a person skilled in the art without departing from the spirit and scope of the present invention. Therefore, the scope of protection of the present invention should be defined by the appended claims.

What is claimed is:

1. An electronic device, comprising:
   a housing, having a side, the side having an accommodating space;

a shared frame, arranged in the accommodating space, the shared frame comprising a first support portion and a second support portion;

a first antenna module, arranged in the accommodating space on the first support portion, for transmitting and receiving a signal of a first frequency band; and a second antenna module, arranged in the accommodating space on the second support portion, for transmitting and receiving a signal of a second frequency band;

wherein a virtual reference surface is defined below the housing, at least a part of the second support portion is arranged perpendicular to the virtual reference surface, and a projection range of the first antenna module on the virtual reference surface in a direction perpendicular to the virtual reference surface partially overlaps with a projection range of the perpendicular part of the second support portion on the virtual reference surface in the direction perpendicular to the virtual reference surface.

2. The electronic device according to claim 1, wherein the first frequency band comprises a 2.4 GHz frequency band and a 5 GHz frequency band, and the second frequency band comprises a 13.56 MHz frequency band.

3. The electronic device according to claim 1, wherein the first antenna module is substantially parallel to the virtual reference surface, and the second antenna module is substantially perpendicular to the virtual reference surface.

4. The electronic device according to claim 1, wherein the first antenna module and the second antenna module have different polarization forms.

5. The electronic device according to claim 1, wherein the first antenna module is linearly polarized, and the second antenna module is circularly polarized.

6. The electronic device according to claim 1, further comprising a first communication circuit coupled to the first antenna module; wherein the first communication circuit performs communication by the first antenna module according to a first communication protocol, and the first communication protocol complies with a wireless local area network (LAN) communication protocol.

7. The electronic device according to claim 1, further comprising a second communication circuit coupled to the second antenna module; wherein the second communication circuit performs communication by the second antenna module according to a second communication protocol, and the second communication protocol complies with a radio-frequency identification (RFID) communication protocol.

8. The electronic device according to claim 1, wherein the second support portion is L-shaped, the second antenna module is formed of a flexible material, and the second antenna module covers the second support portion and is L-shaped.

* * * * *